(12) United States Patent
Reinmuth et al.

(10) Patent No.: US 8,196,474 B2
(45) Date of Patent: Jun. 12, 2012

(54) PRESSURE SENSOR

(75) Inventors: Jochen Reinmuth, Reutlingen (DE);
Peter Schmollngruber, Aidlingen (DE);
Hans Artmann, Boeblingen-Dagersheim (DE)

(73) Assignee: Robert Bosch GmbH, Stuttgart (DE)

( * ) Notice: Subject to any disclaimer, the term of this patent is extended or adjusted under 35 U.S.C. 154(b) by 29 days.

(21) Appl. No.: 12/846,423

(22) Filed: Jul. 29, 2010

(65) Prior Publication Data
US 2011/0048137 A1 Mar. 3, 2011

(30) Foreign Application Priority Data
Aug. 28, 2009 (DE) .................. 10 2009 028 966

(51) Int. Cl.
*G01L 7/00* (2006.01)

(52) U.S. Cl. ......................................... 73/706
(58) Field of Classification Search ............. 73/700–756
See application file for complete search history.

(56) References Cited

U.S. PATENT DOCUMENTS

| | | | | |
|---|---|---|---|---|
| 6,993,976 B2* | 2/2006 | Fessele et al. | .................. | 73/756 |
| 7,363,819 B2* | 4/2008 | Mast et al. | ...................... | 73/754 |
| 2005/0103115 A1* | 5/2005 | Fessele et al. | .................. | 73/756 |
| 2005/0247133 A1* | 11/2005 | Fessele et al. | .................. | 73/753 |
| 2008/0034877 A1* | 2/2008 | Fessele et al. | .................. | 73/700 |
| 2009/0282926 A1* | 11/2009 | Hauer et al. | .................... | 73/756 |

* cited by examiner

*Primary Examiner* — Andre Allen
(74) *Attorney, Agent, or Firm* — Kenyon & Kenyon LLP

(57) ABSTRACT

A simple to implement contacting variant makes it possible to create a reliable electrical connection between the sensor element and the evaluation electronics of a pressure sensor, including at least one media-resistant sensor element, evaluation electronics in the form of at least one additional component connected electrically to the sensor element, and a multipart housing, the sensor element being situated in a first housing area having at least one pressure connection, and the evaluation electronics being situated in a second sealed housing area which is separated from the first housing area by a separating wall. The electrical connection between the sensor element and the evaluation electronics is implemented in the form of media-resistant bonding wires which are guided from the first into the second housing area through the bonded joint area between the separating wall and an additional housing part.

5 Claims, 2 Drawing Sheets

PRESSURE SENSOR

FIELD OF THE INVENTION

The present invention relates to a pressure sensor having at least one media-resistant sensor element, evaluation electronics in the form of at least one additional component electrically connected to the sensor element, and a multipart housing. The sensor element is situated in a first housing area having at least one pressure feed and the evaluation electronics are situated in a second sealed housing area which is separated from the first housing area by a separating wall.

BACKGROUND INFORMATION

Pressure sensors are used to detect the pressure or even the differential pressure in corrosive measuring environments. For example, the pressure determination upstream and downstream from a soot particle filter may be cited as a typical application from the automotive sector. The differential pressure may be used to determine the load of the soot particle filter and regulate the filter burn-off.

In corrosive measuring environments, it is preferred to use sensor elements that are exclusively made of media-resistant materials. In this case, the printed conductors and terminal pads are usually made of gold. To make it possible to implement at least the evaluation electronics according to conventional methods using less expensive materials such as aluminum, the evaluation electronics are situated in an area of the sensor housing into which the measuring medium is unable to penetrate. This housing area for the evaluation electronics is separated off using a separating wall fastened in the housing interior.

The electrical connection between the sensor element and the evaluation electronics in the two housing areas separated from one another is implemented in actual practice using a ceramic carrier having media-resistant printed conductors. The ceramic carrier is situated on the housing floor together with the sensor element and the evaluation electronics. The contact between the terminal pads of the sensor element and the printed conductors of the ceramic carrier is made by media-resistant bonding wires, while it is again possible to make the connection to the evaluation electronics using aluminum wires and aluminum bondlands due to the media separation within the housing. The separating wall, which extends to the housing cover and is or will be connected to it, is then bonded to the ceramic carrier between the sensor element and the evaluation electronics.

In actual practice, this type of electrical connection between the sensor element and evaluation electronics has proven to be very complex and subject to error, as it requires a ceramic carrier provided separately with media-resistant printed conductors and bonding wire connections, on the one hand between the sensor element and the printed conductors and on the other hand between the evaluation electronics and the printed conductors. To that end, the ceramic carrier must first be placed, adjusted and fastened within the housing in order to be contacted later in additional method steps using bonding wires.

SUMMARY OF THE INVENTION

The present invention provides a simple to implement contacting variant which may be used to produce a reliable electrical connection between the sensor element and the evaluation electronics of a pressure sensor of the type under discussion here.

According to the present invention, the electrical connection between the sensor element and the evaluation electronics is implemented in the form of media-resistant bonding wires that are guided from the first into the second housing area through the bonded joint area between the separating wall and an additional housing part.

Accordingly, the contacting between the sensor element and evaluation electronics is made directly via media-resistant bonding wires without the interconnection of printed conductors on an additional carrier. This eliminates the processing and assembly of a corresponding carrier in the sensor housing, which significantly simplifies the manufacture of the pressure sensor of the present invention. The adjusting complexity caused by the interconnection of a carrier with printed conductors is also eliminated. Accordingly, the probability of adjusting errors in the manufacture of the pressure sensor of the present invention is reduced. The adjustment and assembly of the separating wall between the sensor element and the evaluation electronics are relatively non-critical due to the flexibility and ductility of the bonding wires.

In principle, there are various possibilities for implementing the pressure sensor of the present invention and in particular for the design of the housing of such a pressure sensor. For reasons relating to assembly, it proves to be advantageous if the housing includes a housing floor and a housing cover. It is then possible to mount the sensor element and the evaluation electronics to the housing floor in a simple manner before the housing is closed using the housing cover.

In a particularly advantageous variant, receptacles, designed for example as indentations, are provided in the housing floor for the sensor element and the components of the evaluation electronics. This simplifies their positioning and assembly, and the housing floor thus also provides additional stability and protection for the sensor element and the components of the evaluation electronics. In the case of the sensor element, this protection may also be supplemented by a media-resistant protective sheath covering the sensor element.

Furthermore, it proves to be advantageous if a mounting surface is provided in the housing floor for the separating wall which is elevated compared to the mounting surfaces for the sensor element and for the components of the evaluation electronics. This elevation is advantageously dimensioned in such a way that the bonding wires are only very slightly bent or kinked—if at all—when the separating wall is assembled. If the bonding wires are designed in such a way that they are already placed on the elevation before the assembly of the separating wall, it proves to be advantageous to design the elevation or the mounting surface for the separating wall to be narrower than the separating wall to minimize the tensions of the bonding wires and prevent the bonding wires from being kinked. In the event that the bonding wires have not yet been placed on the mounting surface for the separating wall after the bonding process, the separating wall is advantageously made wider than the mounting surface to make tension-free guidance of the bonding wires possible.

The assembly of the pressure sensor of the present invention is also simplified significantly if the separating wall is a component of the housing cover and is adjusted and fastened to the housing floor together with it.

DETAILED DESCRIPTION

Figure 1:
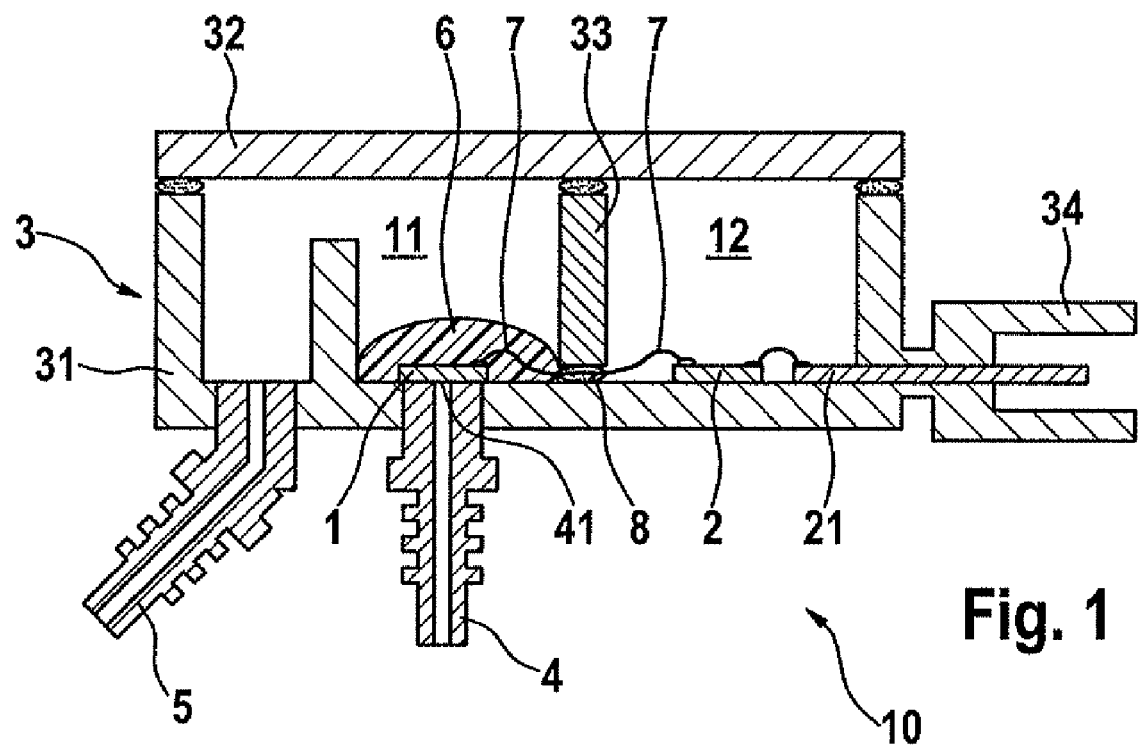
FIG. 1 shows a schematic cross section of a first pressure sensor according to the present invention.

Pressure sensor 10 shown in FIG. 1 is used for detecting differential pressure in a corrosive measuring environment. It includes a media-resistant sensor element 1 and evaluation electronics which may include a plurality of components and are shown here as an additional component 2. Sensor element 1 is connected electrically to evaluation electronics 2 and is situated within housing 3. Sensor element 1 is located in a first housing area 11 having pressure connections 4 and 5, which is separated by a separating wall 33 from a second housing area 12 where evaluation electronics 2 and a plug connector part 21 are located for external contacting. Via pressure connection opening 41 of pressure connection 4, sensor element 1 is situated in such a way that a first measuring pressure is applied to the bottom of sensor element 1, while a second measuring pressure is present on the top of sensor element 1, the second measuring pressure being present within first housing area 11 due to pressure connection 5.

According to the present invention, the electrical connection between sensor element 1 and evaluation electronics 2 is implemented in the form of media-resistant bonding wires 7 that are guided from first housing area 11 into second housing area 12 through bonded joint area 8 between separating wall 33 and housing floor part 31.

In the exemplary embodiment shown here, sensor element 1 is provided with a media-resistant gel protective sheath 6 after the contacting with bonding wires 7. Protective sheath 6 is not only limited to housing area 11. Evaluation electronics 2 in housing area 12 may also be provided with a gel protective sheath.

Housing 3 of the exemplary embodiment described here is made up of three parts, a housing floor part 31, a housing cover 32 and separating wall 33. The two pressure connections 4 and 5 are provided in the part of housing floor part 31 adjoining housing area 11. A plug receptacle 34 for an external plug connection is provided on the side opposite from housing floor part 31 which defines sealed housing area 12. Accordingly, plug connector part 21 is guided at this point to the outside through the housing wall and protrudes into plug receptacle 34. Separating wall 33 is bonded to housing floor 31 between sensor element 1 and evaluation electronics 2 and thus rests directly on bonding wires 7 between sensor element 1 and evaluation electronics 2. Separating wall 33 extends across the entire cross-section of housing 3 to plate-shaped housing cover 32 which is bonded to the side wall of housing floor part 31 and to separating wall 33. In this manner, housing area 12 is sealed off from the measuring medium in housing area 11.

Figure 2:
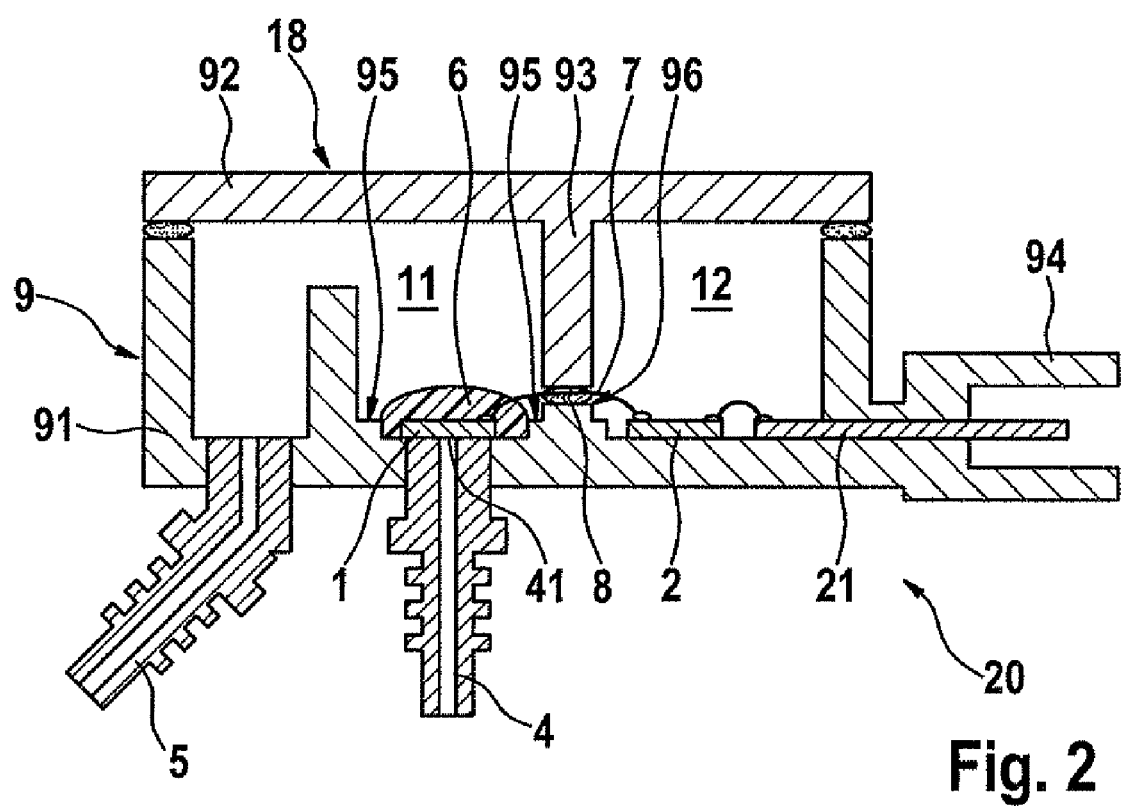
FIG. 2 shows a schematic cross section of a second pressure sensor according to the present invention.

An advantageous version is shown in FIG. 2 and differs from pressure sensor 10 described above only in the type of housing.

Like pressure sensor 10 shown in FIG. 1, pressure sensor 20 includes a media-resistant sensor element 1 which is connected electrically to a component 2 of the evaluation electronics and is situated within a housing 9. However, in contrast to housing 3, this housing 9 is only made up of one housing floor part 91 and one housing cover part 92 on which a separating wall 93 is provided. Separating wall 93 subdivides housing 9 into a first housing area 11 having pressure connections 4 and 5 and into a second housing area 12 which is sealed off from the measuring media. Both pressure connections 4 and 5 are provided in housing floor part 91. Sensor element 1 is situated above pressure connection opening 41, specifically within an annular-shaped socket 95 which concentrically surrounds pressure connection opening 41 and thus provides a receptacle for sensor element 1. As in the case of pressure sensor 10, a first measuring pressure is applied to the bottom of sensor element 1 via pressure connection 4, while a second measuring pressure is present on the top of sensor element 1, the second measuring pressure being present within first housing area 11 due to pressure connection 5. In this case also, the top of sensor element 1 is protected by a media-resistant gel protective sheath 6.

Evaluation electronics 2 are situated together with a plug connector part 21 for the external contacting in housing area 12, where a corresponding plug receptacle 94 is provided for an external plug connection. Evaluation electronics 2 may also be provided with a protective sheath 6.

In contrast to pressure sensor 10, an elevated mounting surface 96 for separating wall 93 of cover part 92 is provided on housing floor part 91, media-resistant bonding wires 7 as an electrical connection between sensor element 1 and evaluation electronics 2 also being guided via the mounting surface. Bonding wires 7 are integrated in the cement in elevated joint area 8 between separating wall 93 and mounting surface 96 of housing floor part 91.

What is claimed is:

1. A pressure sensor comprising:
   at least one media-resistant sensor element, the sensor element being situated in a first housing area having at least one pressure connection;
   evaluation electronics including an additional component connected electrically to the sensor element, the evaluation electronics being situated in a second sealed housing area;
   a multipart housing;
   a separating wall separating the second housing area from the first housing area;
   an additional housing part; and
   media-resistant bonding wires for providing an electrical connection between the sensor element and the evaluation electronics, the bonding wires being guided from the first housing area into the second housing area through a bonded joint area between the separating wall and the additional housing part.

2. The pressure sensor according to claim 1, wherein the housing has a housing floor, a housing cover, and at least one of (a) at least one receptacle situated in the housing floor for the sensor element and (b) at least one receptacle for the evaluation electronics.

3. The pressure sensor according to claim 1, wherein the housing has a housing floor, a housing cover, and an elevated mounting surface situated in the housing floor for the separating wall.

4. The pressure sensor according to claim 1, wherein the housing has a housing floor and a housing cover, the separating wall being a component of the housing cover.

5. The pressure sensor according to claim 1, wherein at least a top of the sensor element has a media-resistant protective sheath.

* * * * *